United States Patent
Ang et al.

(10) Patent No.: US 6,544,848 B1
(45) Date of Patent: Apr. 8, 2003

(54) METHOD TO FORM AN ASYMMETRICAL NON-VOLATILE MEMORY DEVICE USING SMALL IN-SITU DOPED POLYSILICON SPACERS

(75) Inventors: Chew Hoe Ang, Singapore (SG); Eng Hua Lim, S'pore (SG); Randall Cha, Singapore (SG); Jia Zhen Zheng, Singapore (SG); Elgin Quek, Singapore (SG); Mei Sheng Zhou, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/224,212

(22) Filed: Aug. 20, 2002

(51) Int. Cl.⁷ .......................................... H01L 21/8247
(52) U.S. Cl. ....................................... 438/260; 438/267
(58) Field of Search ................................. 438/257–267

(56) References Cited

U.S. PATENT DOCUMENTS

| | | | |
|---|---|---|---|
| 5,963,806 A | 10/1999 | Sung et al. | 438/266 |
| 6,090,668 A | 7/2000 | Lin et al. | 438/266 |
| 6,117,733 A | 9/2000 | Sung et al. | 438/265 |
| 6,204,126 B1 | 3/2001 | Hsieh et al. | 438/267 |
| 6,242,308 B1 | 6/2001 | Hsieh et al. | 438/265 |
| 6,429,075 B2 * | 8/2002 | Yeh et al. | 438/260 |
| 6,495,420 B2 * | 12/2002 | Tseng | 438/267 |

* cited by examiner

*Primary Examiner*—Richard Booth
(74) *Attorney, Agent, or Firm*—George O. Saile; Rosemary L.S. Pike

(57) ABSTRACT

A new method of forming a sharp tip on a floating gate in the fabrication of a EEPROM memory cell is described. A first gate dielectric layer is provided on a substrate. A second gate dielectric layer is deposited overlying the first gate dielectric layer. A floating gate/control gate stack is formed overlying the second gate dielectric layer. One sidewall portion of the floating gate is covered with a mask. The second gate dielectric layer not covered by the mask is etched away whereby an undercut of the floating gate is formed in the second gate dielectric layer. The mask is removed. Polysilicon spacers are formed on sidewalls of the floating gate wherein one of the polysilicon spacers fills the undercut thereby forming a sharp polysilicon tip to improve the erase efficiency of the memory cell.

25 Claims, 4 Drawing Sheets

US 6,544,848 B1

METHOD TO FORM AN ASYMMETRICAL NON-VOLATILE MEMORY DEVICE USING SMALL IN-SITU DOPED POLYSILICON SPACERS

BACKGROUND OF THE INVENTION (1) Field of the Invention

The invention relates to a method of fabricating semiconductor memory devices employing floating gates, and more particularly, to a method of fabricating memory devices employing floating gates having enhanced electron tunneling during erase.

(2) Description of the Prior Art

One class of semiconductor memory devices employs floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. A tunneling oxide, necessary for the erase function of the cell, is situated below the floating gate of the memory cell. Some current EEPROM devices employ a sharp polysilicon tip on the floating gate to enhance electron tunneling from the floating gate during erase, thus achieving more efficient erase characteristics.

U.S. Pat. No. 6,242,308 to Hsieh et al, U.S. Pat. No. 6,204,126 to Hsieh et al, and U.S. Pat. No. 6,117,733 to Sung et al use oxidation to form a sharp tip in the adjacent polysilicon gate. U.S. Pat. No. 5,963,806 to Sung et al undercuts the dielectric underlying the floating gate. A second polysilicon layer overlying one side of the floating gate forms a sharp tip in the undercut area. U.S. Pat. No. 6,090,668 to Lin et al uses a high pressure etching to form a slope in a polysilicon layer. A dielectric layer fills the sloping recess in the polysilicon. After patterning, the sharp edge of the slope forms a polysilicon sharp tip.

SUMMARY OF THE INVENTION

A principal object of the present invention is to provide an effective and very manufacturable method of forming a sharp tip on a floating gate in the fabrication of integrated circuits.

Another object of the present invention is to provide an effective and very manufacturable method of forming a sharp tip on a floating gate in the fabrication of an EEPROM memory cell.

A further object of the invention is to provide a method of forming a sharp polysilicon tip on a floating gate using small polysilicon spacers.

Yet another object is to provide a method for forming an asymmetrical sharp poly tip using small polysilicon spacers.

In accordance with the objects of this invention a new method of forming a sharp tip on a floating gate in the fabrication of a EEPROM memory cell is achieved. A first gate dielectric layer is provided on a substrate. A second gate dielectric layer is deposited overlying the first gate dielectric layer. A control/floating gate stack is formed overlying the second gate dielectric layer. One sidewall portion of the gate stack is covered with a mask. The second gate dielectric layer not covered by the mask is etched away whereby an undercut of the floating gate is formed in the second gate dielectric layer. The mask is removed. Polysilicon spacers are formed on sidewalls of the floating gate wherein one of the polysilicon spacers fills the undercut thereby forming a sharp polysilicon tip to improve the erase efficiency of the memory cell.

BRIEF DESCRIPTION OF THE DRAWINGS

In the accompanying drawings forming a material part of this description, there is shown.

DESCRIPTION OF THE PREFERRED EMBODIMENTS

Figure 1:
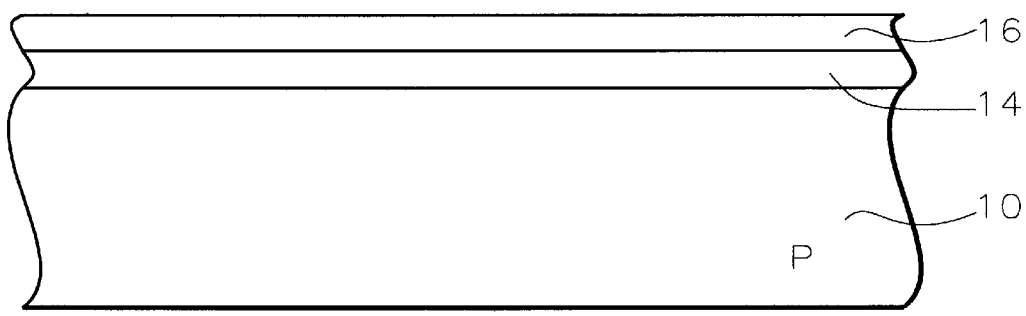
FIGS. 1 through 6 schematically illustrate in cross-sectional representation a preferred embodiment of the present invention.

Referring now more particularly to FIG. 1, there is illustrated a portion of a partially completed memory cell. Semiconductor substrate 10 is preferably composed of monocrystalline silicon. The semiconductor substrate illustrated has been doped as a p-substrate.

Now, a composite gate dielectric layer 14/16 is formed on the surface of the substrate. For example, the first gate dielectric layer 14 is grown to a thickness of between about 90 and 110 Angstroms on the surface of the substrate. The first gate dielectric layer may comprise silicon dioxide. The second gate dielectric layer 16 comprising. silicon nitride is deposited over the first gate dielectric layer by low pressure chemical vapor deposition (LPCVD) or jet vapor deposition (JVD) to a thickness of between about 35 and 65 Angstroms. The second gate dielectric layer must be of a material that can be etched selectively with respect to the first gate dielectric layer.

Figure 2:
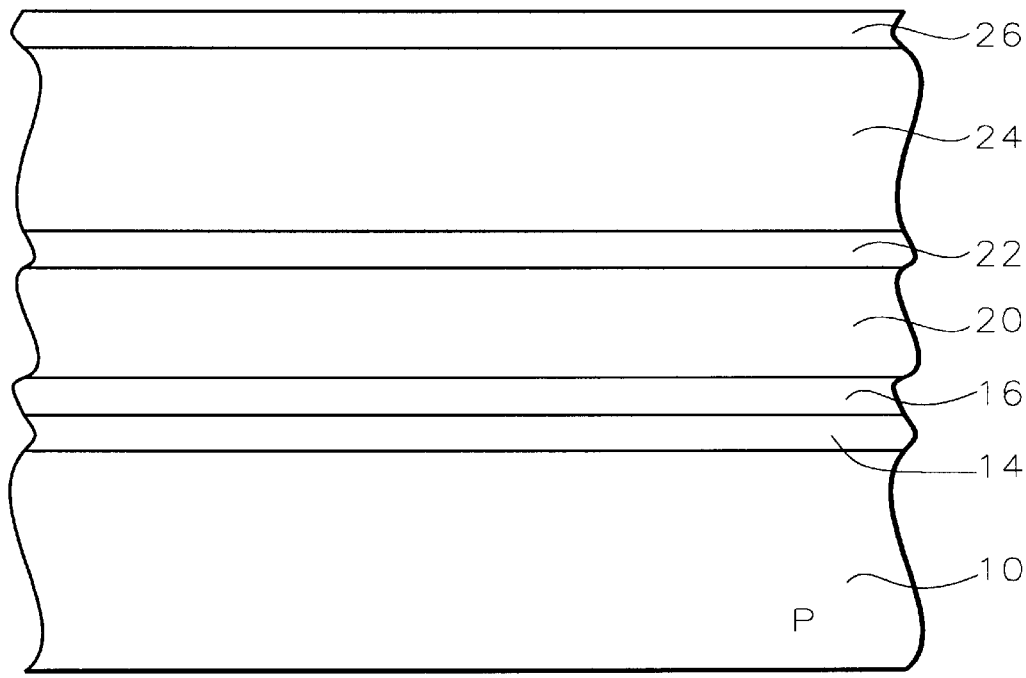

Referring now to FIG. 2, a polysilicon gate stack is deposited over the composite gate dielectric layer. A first in-situ doped polysilicon layer 20 is deposited over the composite gate dielectric layer to a thickness of between about 1000 and 1500 Angstroms. Alternatively, the first polysilicon layer can be deposited undoped and later doped by ion implantation.

Now, an interpoly dielectric layer 22 is deposited over the first polysilicon layer 20. This layer may comprise silicon dioxide deposited and/or grown by LPCVD or furnace oxidation to a thickness of between about 80 and 120 Angstroms. A second polysilicon layer 24 is deposited over the interpoly dielectric layer by LPCVD to a thickness of between about 1000 and 1500 Angstroms.

Finally, a hard mask 26, comprising silicon oxide or silicon oxynitride, for example, is deposited over the second polysilicon layer to a thickness of between about 400 and 700 Angstroms.

Figure 3:
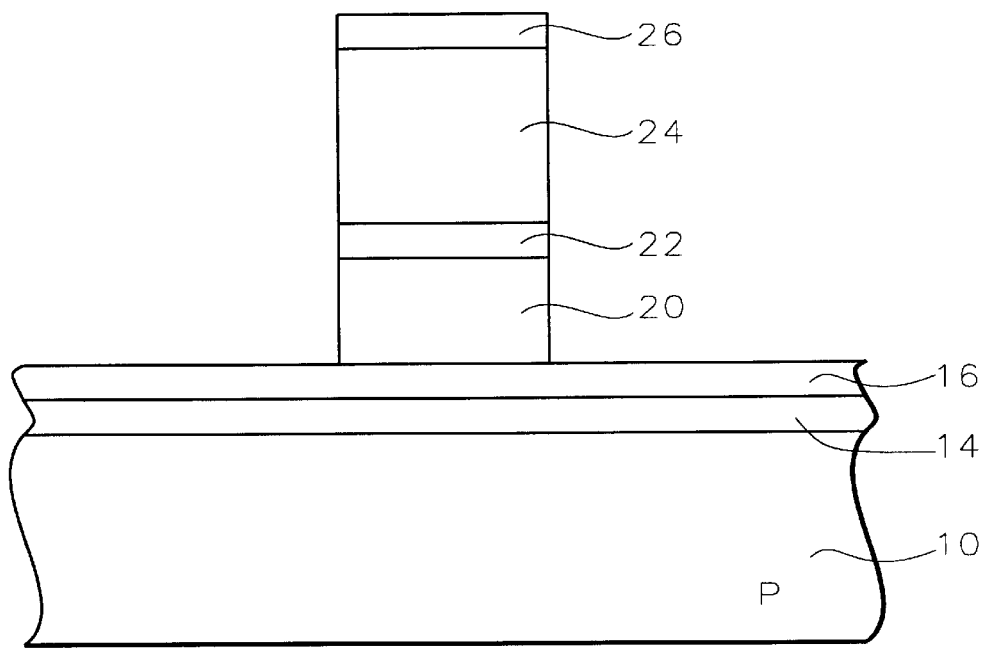

The gate stack is etched, as shown in FIG. 3, to the composite gate dielectric layer 14/16 to form the completed gate stack.

Figure 4:
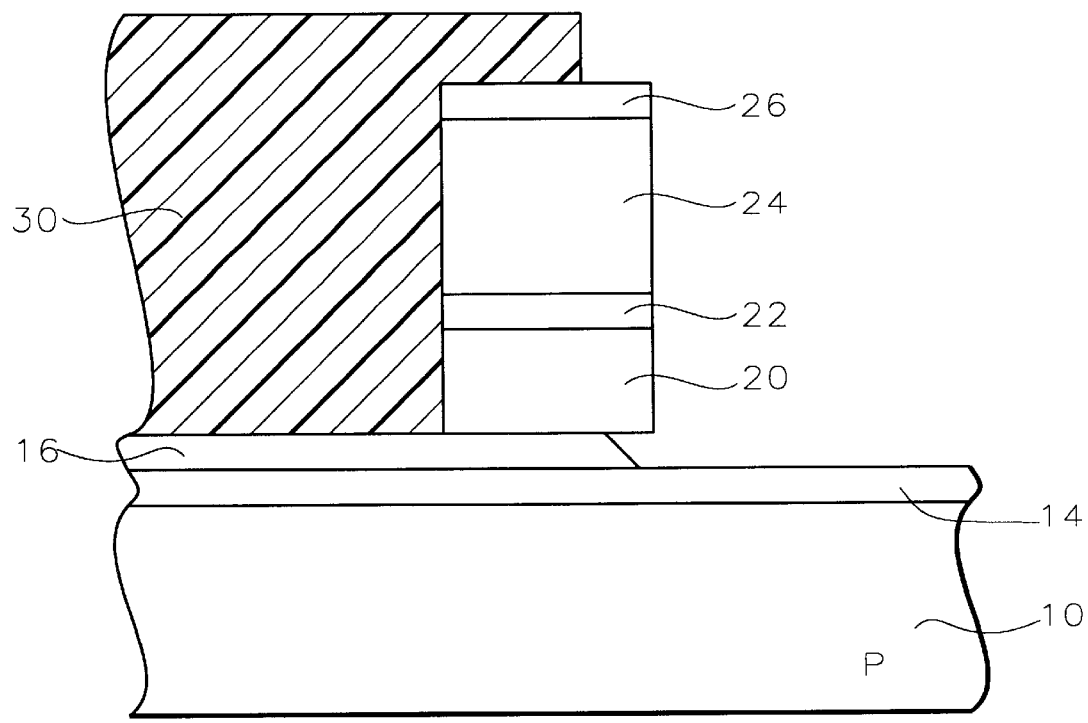

Now, a mask 30 is formed to cover one side of the gate stack, as shown in FIG. 4. The topmost gate dielectric layer 16 is etched away isotropically where it is not covered by the mask 30. As shown, the gate dielectric layer 16 slightly undercuts the first polysilicon layer 20 at an obtuse angle with the first gate dielectric layer 14. The undercut is between about 150 to 250 Angstroms from the edge of the gate stack. This may be a wet etch using hot phosphoric acid to remove the exposed silicon nitride layer 16 without etching the silicon dioxide layer 14 or the polysilicon layers.

Figure 5:
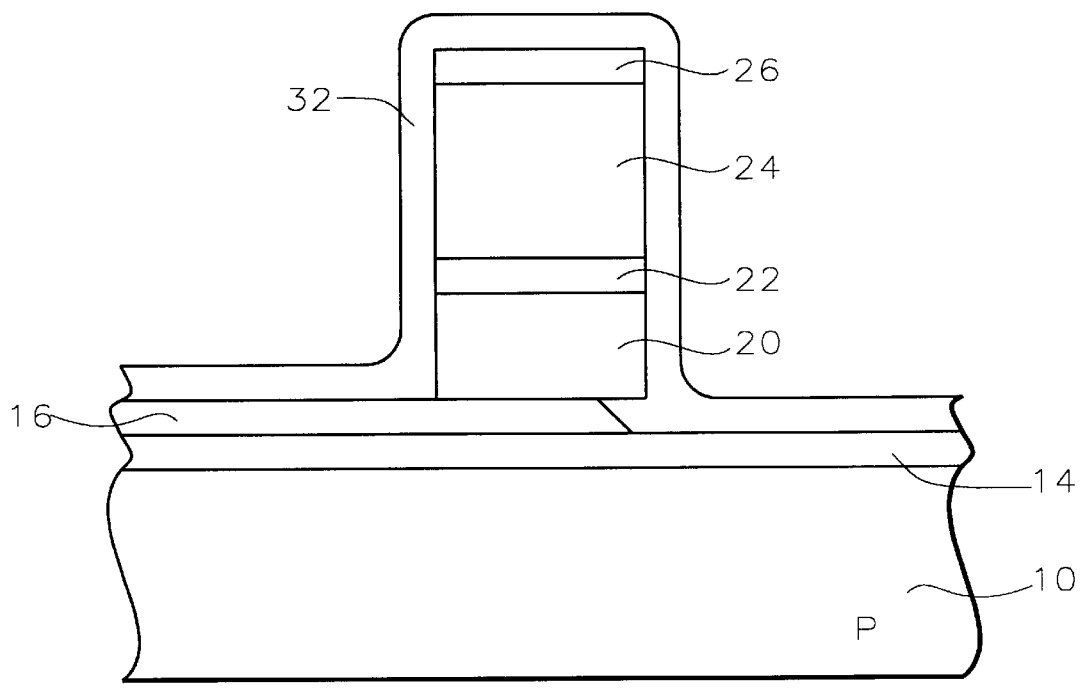

Now, the mask 30 is stripped away and a pre-clean step is performed to remove native oxide formed on the polysilicon layers. A thin layer of polysilicon 32 is deposited over the gate dielectric layers and the gate stack, as shown in FIG. 5. The polysilicon layer 32 is deposited by LPCVD to a thickness of between about 300 and 500 Angstroms. This polysilicon layer is preferably deposited undoped so that it can be doped by diffusion from the floating gate during source/drain annealing. AN in-situ doped polysilicon spacer (if n-type) could counterdope the p-type gates.

Figure 6:
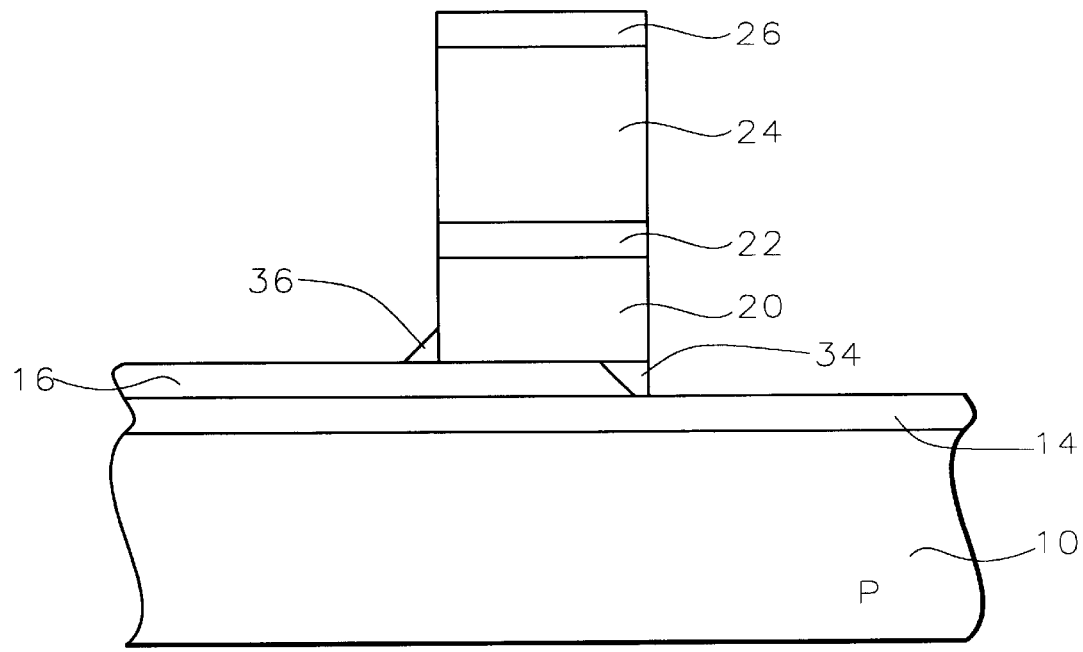

Referring now to FIG. 6, the thin polysilicon layer 32 is anisotropically etched away to leave small polysilicon spacers 34 and 36. Spacer 34 fills the undercut of the top dielectric layer 16 under the first polysilicon layer 20. The spacer 36 lies on a lower sidewall of the first polysilicon layer 20 overlying the second gate dielectric layer 16. These spacers 34 and 36 should be as small as possible; that is, less than about 300 Angstroms high and less than about 300 Angstroms wide. Excessively tall spacers will affect device source/drain formation.

The spacer 34 forms an electron-injecting sharp tip of n-doped polysilicon. Only one sharp tip is needed for device operation. Sharp tips could be formed at both sides of the gate, saving a masking step. If the sharp tip on the drain side is correctly positioned, it could serve. as a collector of hot electrons during programming, or even further improve the erase efficiency by allowing electrons to tunnel to the drain as well as the source. By having the sharp tip only on the source side, we don't have to worry about electrons tunneling from the floating gate to the drain during a read operation, for example, or interfering with hot electron programming. Also, in the case of a symmetrical device, steps have to be taken to prevent over-erasure in which the threshold voltage after erase becomes too small.

The polysilicon sharp tip improves erase efficiency since lower voltages can be used as a result of electron field enhancement at the tip.

Figure 7:
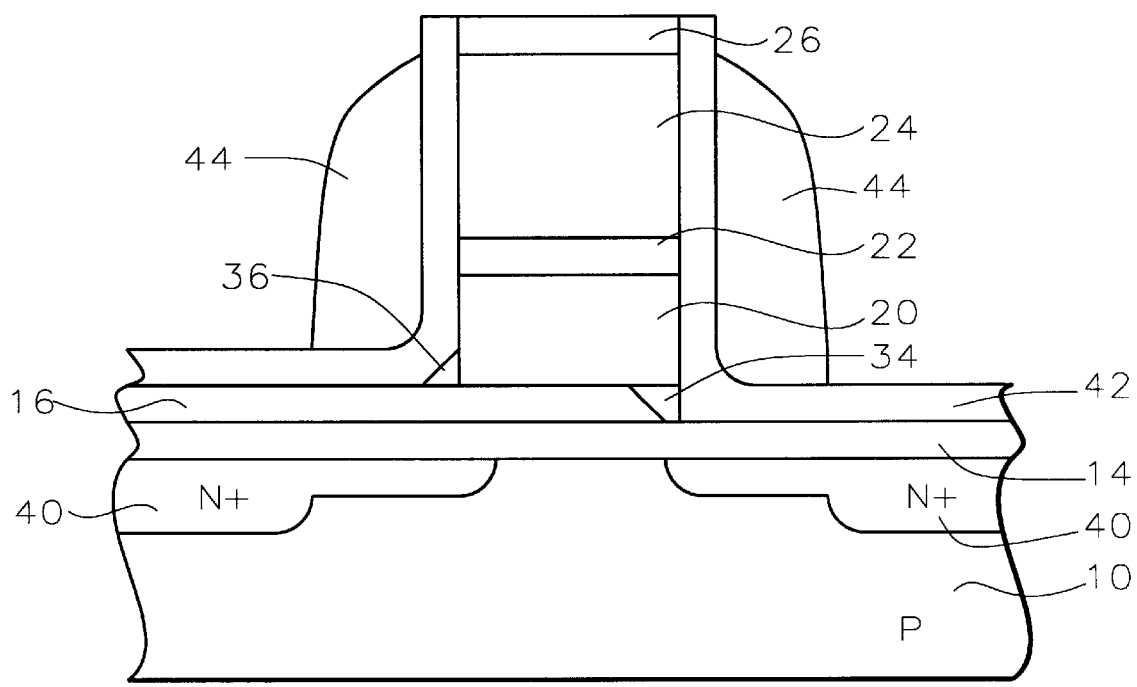
FIG. 7 schematically illustrates in cross-sectional representation a completed EEPROM device fabricated by the process of the present invention.

Processing continues to complete the EEPROM device. Source/drain regions 40 and sidewall spacers 42 and 44 are formed as conventional in the art and as illustrated in FIG. 7. This completes floating gate 20 and control gate 24 of the EEPROM device.

The process of the present invention provides a simple method for forming a sharp polysilicon tip on the floating gate of an EEPROM device. The resulting asymmetrical non-volatile memory device has enhanced electron tunneling and resulting increased erase efficiency.

While the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon tip to improve the erase efficiency of a memory cell comprising:

providing a composite gate dielectric layer on a substrate comprising a first gate dielectric layer underlying a second gate dielectric layer wherein said second gate dielectric layer can be etched selectively to said first gate dielectric layer;

forming a gate stack overlying said composite gate dielectric layer;

covering one sidewall portion of said gate stack with a mask and etching away said second gate dielectric layer on another sidewall portion of said gate stack not covered by said mask whereby an undercut of said gate stack on said sidewall portion not covered by said mask is formed in said second gate dielectric layer;

removing said mask; and thereafter forming polysilicon spacers on sidewalls of said gate stack wherein one of said polysilicon spacers fills said undercut thereby forming said polysilicon tip to improve said erase efficiency of said memory cell.

2. The method according to claim 1 wherein said first gate dielectric layer comprises silicon dioxide and has a thickness of between about 90 and 110 Angstroms.

3. The method according to claim 1 wherein said second gate dielectric layer comprises silicon nitride and has a thickness of between about 35 and 65 Angstroms.

4. The method according to claim 1 wherein said step of forming said gate stack comprises:

depositing a first polysilicon layer overlying said composite gate dielectric layer;

depositing an interpoly dielectric layer overlying said first polysilicon layer;

depositing a second polysilicon layer overlying said interpoly dielectric layer;

depositing a hard mask layer overlying said second polysilicon layer; and patterning said first polysilicon layer, said interpoly dielectric layer, said second polysilicon layer, and said hard mask layer to form said gate stack.

5. The method according to claim 1 further comprising:

forming source and drain regions in said substrate adjacent to said gate stack.

6. The method according to claim 4 wherein said first polysilicon layer forms a floating gate and wherein said second polysilicon layer forms a control gate.

7. The method according to claim 4 wherein said first polysilicon layer is in-situ doped.

8. The method according to claim 1 wherein said undercut extends between about 150 to 250 Angstroms under said gate stack.

9. The method according to claim 6 wherein said polysilicon spacers are doped by diffusion from said floating gate.

10. The method according to claim 1 wherein said polysilicon tip underlies a floating gate in said gate stack thereby improving erase characteristics of said memory cell.

11. A method of forming a polysilicon tip to improve the erase efficiency of a memory cell comprising:

providing a composite gate dielectric layer on a substrate comprising a first gate dielectric layer underlying a second gate dielectric layer wherein said second gate dielectric layer can be etched selectively to said first gate dielectric layer;

forming a gate stack overlying said composite gate dielectric layer wherein said gate stack comprises a control gate overlying a floating gate;

covering one sidewall portion of said gate stack with a mask and etching away said second gate dielectric layer on another sidewall portion of said gate stack not covered by said mask whereby an undercut of said floating gate on said sidewall portion not covered by said mask is formed in said second gate dielectric layer;

removing said mask; and thereafter forming polysilicon spacers on sidewalls of said gate stack wherein one of said polysilicon spacers fills said undercut thereby forming said polysilicon tip to improve said speed of said memory cell.

12. The method according to claim 11 wherein said first gate dielectric layer comprises silicon dioxide and has a thickness of between about 90 and 110 Angstroms.

13. The method according to claim 11 wherein said second gate dielectric layer comprises silicon nitride and has a thickness of between about 35 and 65 Angstroms.

14. The method according to claim 11 wherein said step of forming said gate stack comprises:

depositing a first polysilicon layer overlying said composite gate dielectric layer;

depositing an interpoly dielectric layer overlying said first polysilicon layer;

depositing a second polysilicon layer overlying said interpoly dielectric layer;

depositing a hard mask layer overlying said second polysilicon layer; and patterning said first polysilicon layer, said interpoly dielectric layer, said second polysilicon layer, and said hard mask layer to form said gate stack wherein said first polysilicon layer forms said floating gate and wherein said second polysilicon layer forms said control gate.

15. The method according to claim 11 further comprising:

forming source and drain regions in said substrate adjacent to said gate stack.

16. The method according to claim 14 wherein said first polysilicon layer is in-situ doped.

17. The method according to claim 11 wherein said undercut extends between about 150 to 250 Angstroms under said gate stack.

18. The method according to claim 11 wherein said polysilicon spacers are doped by diffusion from said floating gate.

19. A method of forming a polysilicon tip to improve the speed of a memory cell comprising:

providing a first gate dielectric layer on a substrate;

depositing a second gate dielectric layer overlying said first second gate:dielectric layer;

forming a floating gate overlying said second gate dielectric layer;

covering one sidewall portion of said floating gate with a mask and etching away said second gate dielectric not covered by said mask whereby an undercut of said floating gate is formed in said second gate dielectric layer;

removing said mask; and thereafter forming polysilicon spacers on sidewalls of said floating gate wherein one of said polysilicon spacers fills said undercut thereby forming said polysilicon tip to improve said speed of said memory cell.

20. The method according to claim 19 wherein said second gate dielectric layer can be etched selectively to said first gate dielectric layer.

21. The method according to claim 19 wherein said first gate dielectric layer comprises silicon dioxide and has a thickness of between about 90 and 110 Angstroms.

22. The method according to claim 19 wherein said second gate dielectric layer comprises silicon nitride and has a thickness of between about 35 and 65 Angstroms.

23. The method according to claim 19 further comprising:

forming a control gate overlying said floating gate and separated from said floating gate by an interpoly dielectric layer; and forming source and drain regions in said substrate adjacent to said floating gate.

24. The method according to claim 19 wherein said undercut extends between about 150 to 250 Angstroms under said floating gate.

25. The method according to claim 19 wherein said polysilicon spacers are doped by diffusion from said floating gate.

* * * * *